United States Patent
Freeman, Jr. et al.

[11] Patent Number: 5,287,002
[45] Date of Patent: Feb. 15, 1994

[54] PLANAR MULTI-LAYER METAL BONDING PAD

[75] Inventors: John L. Freeman, Jr., Mesa; Clarence J. Tracy, Tempe, both of Ariz.

[73] Assignee: Motorola, Inc., Schaumburg, Ill.

[21] Appl. No.: 889,807

[22] Filed: May 29, 1992

Related U.S. Application Data

[62] Division of Ser. No. 716,454, Jun. 17, 1991, Pat. No. 5,149,674.

[51] Int. Cl.⁵ .................. H01L 23/48; H01L 29/40; H01L 29/52; H01L 29/46
[52] U.S. Cl. .................... 257/781; 257/734; 257/736; 257/748; 257/750; 257/752; 257/758; 257/759; 257/760; 257/774
[58] Field of Search ............ 257/756, 758, 774, 781, 257/734, 736, 748, 750, 752, 758, 759, 760, 774, 781, 786

[56] References Cited
U.S. PATENT DOCUMENTS

| | | | |
|---|---|---|---|
| 4,755,482 | 7/1988 | Nagakubo | 257/774 |
| 4,933,303 | 6/1990 | Mo | 257/774 |
| 5,006,486 | 4/1991 | Schucker | 437/220 |
| 5,063,175 | 11/1991 | Broadbent | 257/774 |

Primary Examiner—Jerome Jackson
Assistant Examiner—Carl Whitehead, Jr.
Attorney, Agent, or Firm—Gary F. Witting; Joe E. Barbee

[57] ABSTRACT

A planarized multi-layer metal bonding pad. A first metal bonding pad layer (13) that defines a metal bonding pad is provided. A first dielectric layer (14) is provided with a multitude of vias (17) that covers the first metal bonding pad layer (13), thereby exposing portions of the first metal bonding pad layer (13) through the multitude of vias (17) in the first dielectric (14). A second metal bonding pad layer (18) that further defines the metal bonding pad is deposited on the first dielectric layer (14) making electrical contact to the first metal bonding pad layer through the multitude of vias (17). Planarization of the second metal bonding pad layer (18) is achieved by having the second metal bonding pad layer (18) cover the first dielectric layer (14) and making contact through the vias (17).

4 Claims, 1 Drawing Sheet

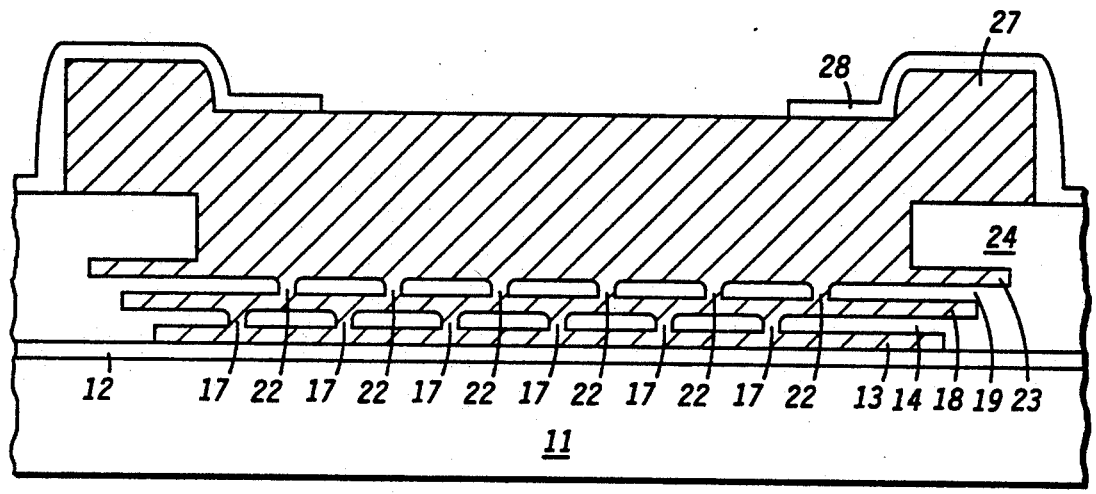

PLANAR MULTI-LAYER METAL BONDING PAD

This is a division of application Ser. No. 07/716,454, filed Jun. 17, 1991, now U.S. Pat. No. 5,149,674.

BACKGROUND OF THE INVENTION

This invention relates, in general, to semiconductor products, and more particularly, to making semiconductor devices.

Generally, most very large scaled integrated (VLSI) semiconductor circuits are manufactured by depositing and patterning conductive and nonconductive materials or layers and by stacking the layers on top of each other. As devices become more sophisticated and more complex, the number of layers stacked on each other tends to increase, and as the number of layers increase, planarity problems generally occur. Much attention has been given to solving these planarity problems or issues concerning interior portions of the semiconductor circuit; however, little attention has been given to solving periphery planarity issues and more particularly to solving planarity problems of bonding pads or probe pads of the semiconductor circuit.

At present, most VLSI semiconductor circuits use one or two levels of metal to interconnect the semiconductor devices on a VLSI semiconductor circuit. However, as semiconductor VLSI devices have become more complex, the number of metal layers required to interconnect the semiconductor devices increases. Generally, by increasing the number of metal layers to more than two, several problems occur while fabricating bonding pads and probe pads, such as control of critical dimensions and metal thinning at peripheral edges of the bonding pads or probe pads.

These problems generally are caused by a lack of planarity of the bonding pads or probe pads in relation to the interior of the semiconductor VLSI devices. As the complexity of VLSI semiconductor circuits increase and the number of metal layers increase, severity of the nonplanarity of bonding pads and probe pads will also increase.

Therefore, a method for planarizing bonding pads and probe pads would be highly desirable. Also, by achieving more planar bonding pads and probe pads, an increased control of critical dimensions would result, and metal thinning at the edges of the bonding pads or probe pads would be greatly reduced or eliminated.

SUMMARY OF THE INVENTION

Briefly stated, according to the invention, a method is provided for planarizing a multi-layer metal pad on a semiconductor device. A first metal layer is provided. Then a first dielectric layer is provided with a multitude of vias covering the first metal layer, thereby exposing portions of the first metal layer through the multitude of vias in the first dielectric. A second metal layer is deposited on the first dielectric layer making electrical contact to the first metal layer through the multitude of vias, and planarizing the second metal layer by having the second metal layer cover the first dielectric layer.

BRIEF DESCRIPTION OF THE DRAWING

A single FIGURE illustrates a simplified cross-sectional view of a multi-layer pad that is planarized.

DETAILED DESCRIPTION OF THE DRAWINGS

Illustrated in the single drawing is a simplified cross-sectional view of a multi-layer metal bonding pad, a multi-layer metal probe pad, or a multi-layer metal contact 10 that is planarized. In the present invention, planarization of multiple layers of metal occur because sequential metal layers are elevated by interposed dielectric layers that have a multitude of vias. The multitude of vias allow for mechanical and electrical contact to be made through the interposed dielectric. Although the single FIGURE illustrates only one multi-layer metal bonding pad 10, it should be understood that generally there are a plurality of multi-layer metal bonding pads on semiconductor substrate 11. Additionally, the sole FIGURE illustrates only a small portion of a semiconductor circuit, and many structures that are not necessary for understanding the present invention are not illustrated. However, it should be understood that bonding pad 10 conducts electrical signals into and out of the integrated circuit located on the remainder of semiconductor substrate 11.

In the prior art, multi-layer metal bonding pads have been formed by patterning sequential metal layers so that the bonding pads and the integrated circuit are interconnected. Generally, the integration of the multi-layer metal bonding pads was accomplished by depositing and then patterning a first metal layer forming bonding pads in the periphery and connecting the bonding pads to the integrated circuit by metal lines that were made of the same deposited metal as the bonding pad and were patterned at the same time. A dielectric layer was deposited and patterned into a large opening on the bonding pad. A second metal layer was then deposited and patterned so that the second metal bonding pads were directly and vertically stacked on top of each other. This process of depositing and patterning both dielectric layers and metal layers was continued until a required number of layers was achieved, thus forming a multi-layer metal bonding pad. The bonding pad areas of the metal layers typically were patterned into rectangular pads, and the sequential dielectric layers typically were patterned with a single large rectangular opening which was overlaid on the metal layer or bonding pad, thus exposing the metal layer or bonding pad through the single large rectangular opening. By continuing this sequential process, a large difference in height develops between a total thickness of dielectric layers and metal layers, and a total thickness of just metal layers in the bonding pad area which causes several problems, such as control of critical dimensions and metal thinning.

Electrical and mechanical contact between two overlaying metal layers was achieved through the single large opening by stepping down a height or step of a thickness of the dielectric layer from which the single large opening was made. Conventionally, as the number of dielectric layers and the number of metal layers increased, a height difference between the bonding pad metal layers and the rest of the circuit increased. This height difference caused a large cavity or tub to form in the conventional bonding pad.

Usually problems occurred with controlling critical dimensions because of an uneven photoresist thickness distribution between the tub in the bonding pad and the rest of the integrated circuit during photolithography processing. The tub in the bonding pad filled with more photoresist than the rest of the integrated circuit. This uneven photoresist distribution made control of critical dimensions of small features, which required less light to expose, difficult to maintain because the photoresist in the tubs required more light to expose. Thus, in order to fully expose the photoresist in the tubs in the bonding pads, the small features were over exposed with an associated loss of control of dimensions.

Additionally, problems occurred with metal thinning at the edge of bonding pad tub as the metal steps over the dielectric layer into the single large opening where the previously patterned metal layer or bonding pad was exposed. Metal thinning is especially important for the metal lines that connect the bonding pads to interconnects in the integrated circuit. Metal thinning at the edges of the bonding pad became more severe as the number of metal layers increased. Metal thinning at the edges of the bonding pad can result in an insufficient amount of metal to carry a required current into and out of the bonding pad. In more severe cases, the metal layer separates so that no electrical or mechanical contact is made, resulting in the integrated circuit not working.

Generally, the conventional method of making multi-layer metal bonding pads is sufficient for two layers of metal; however, as the number of metal layers increases above two metal layers, several problems occur, such as control of critical dimensions and metal thinning at the step at the edge of the bonding pad. These problems, while not being severe enough in some cases to cause manufacturing difficulties, nevertheless are present and noticeable even in the conventional method of making two layer metal bonding pads.

In the present invention, dielectric layer 12 is made by conventional methods well known in the semiconductor art. In a preferred embodiment, dielectric layer 12 is made of silicon dioxide; however, dielectric layer 12 can be made of any suitable dielectric materials. Dielectric layer 12 provides support for a first metal layer 13 of multi-layer metal bonding pad 10.

First metal layer 13 is made by depositing and patterning a metal layer on dielectric layer 12 by well-known methods. Generally, first metal layer 13 is representative of all metal layers 18, 23, 27 in thickness, composition, method of deposition, and method of patterning. First metal layer 13 is made of an aluminum alloy; however, any suitable metal or alloy could be used, such as copper, titanium, tungsten, or layering different suitable metals. Thickness of first metal layer 13 ranges from 0.5 micron to 4.0 microns and is substantially adjusted to 1.0 microns. It should be realized that thickness of specific metal layers, while important for specific integrated circuits, is not important for understanding the present invention. Typically, patterning of metal layer 13 is shaped in a rectangular form.

First dielectric layer or dielectric layer 14 is deposited on first metal layer 13. Generally, dielectric 14 is representative of all dielectric layers 19, 24, and 28 in thickness, composition, method of deposition, and method of patterning. Dielectric layer 14 is made of silicon dioxide; however, other suitable dielectric materials, such as oxynitride or borosilicate glass could also be used. Thickness of dielectric 14 ranges from 0.5 micron to 3.0 microns and is substantially adjusted to 1.0 micron. It should be realized that thicknesses of specific dielectric layers, while important for specific integrated circuits, is not important for understanding the present invention.

In the present invention, a multitude of vias 17 are patterned by conventional methods in dielectric layer 14, thereby exposing portions of metal layer 13 through vias 17. Generally, vias 17 are arranged in a rectangular array over metal layer 13. In a preferred embodiment, sizing of individual vias 17 should be similar or slightly larger than other features that are being patterned on dielectric layer 14. Making vias 17 slightly larger than other features that are being patterned on dielectric 14 results in relaxation of dimensional control constraints and makes patterning of vias 17 easier. Typically, sizing of vias 17 and vias 22 range from 0.4 micron to 4.0 microns. Shaping of individual via openings 17 and vias 22 is not critical but can be done as long as first metal layer 13 and second metal layer 18 are clearly exposed. Determination of how many vias 17 and 22 are required is determined generally by current density requirements. Generally, a sufficient number of vias 17 and 22 must be provided to be able to conduct a maximum amount of current through bonding pad 10. In a preferred embodiment, a safety factor of one or two times the required number of vias 17 and vias 22 can be made in dielectric layers 14 and 19. Additionally, in some embodiments of the present invention, a plug process can be used to fill vias 17 and vias 22 prior to deposition of subsequent metal layers, thus making it possible to stack vias vertically on top of each other, as well as making it possible to fill vias that have a large aspect ratio i.e. vias that have a greater height then their width. Second metal layer 18 is deposited and patterned by ordinary methods well known in the semiconductor art. Generally, second metal layer 18 is made in the same shape and of the same materials as previously discussed for first metal layer 13. Metal layer 18 is deposited in such a manner so that metal layer 18 fills vias 17, thereby allowing a mechanical and an electrical contact to be made between first layer metal 13 and second metal layer 18. Planarization of second metal layer 18 is achieved by covering areas of dielectric layer 14 that is between vias 17, thereby elevating second metal layer 18 by a thickness of dielectric 18.

Second dielectric layer 19 is deposited and patterned as in the previously discussed methods in making dielectric layer 14. Vias 22 are made similarly as vias 17; however, in a preferred embodiment, vias 22 are staggered or offset so that vias 22 are not stacked on vias 17. This offsetting of vias 17 and 22 allows for easier processing. However, stacking of vias 17 and 22 can be done.

Third metal layer 23 is deposited and patterned by previously discussed methods. Third metal layer 23 is deposited so that it covers dielectric layer 18 and fills vias 22. Electrical and mechanical contact between third metal layer 23 and second metal layer 18 is made by filling vias 22 in dielectric layer 19 with deposited metal layer 23. Planarization of metal layer 23 is achieved by having metal layer 23 cover dielectric layer 19, thus raising metal layer 23 a height of dielectric layer 19.

Continuation of sequential deposition and patterning of dielectric layers and metal layers results in continual planarity with an increasing number of layers. It should be evident that by continuation of this sequential process that several benefits occur, such as planarizing any multi-metal bonding pad, metal thinning is either greatly reduced or eliminated, and a substantial increase in the number of possible sequential layers that can be stacked while still maintaining planarity.

Third dielectric layer 24 is deposited and patterned by well-known methods. In a preferred embodiment of the present invention, the top most dielectric layer or dielectric layer 24 is patterned with a single large opening, thus allowing metal layer 23 to be completely exposed so that fourth metal layer 27 completely covers topmost metal layer 23. However, dielectric layer 24 could be made with a multitude of vias as in dielectric layer 14 and dielectric layer 19. Dielectric layer 24 is made of similar materials as previously discussed for dielectric layer 14.

Fourth metal layer 27 is deposited and patterned by previously discussed methods In the present invention, topmost metal layer or a last metal layer 27 steps down a relatively small height or a relatively small step to cover metal layer 23, whereas in the prior art a much greater height or a much greater step had to be stepped down.

Planarization of bonding pad 10 is achieved by sequential layering of dielectric layers with a multitude of vias and metal layers. By using the present invention and planarizing bonding pad 10, only a small tub is formed or no tub is formed. This results in an even distribution of photoresist, thereby allowing an even uniform exposure across the integrated circuit, yielding greater control of critical dimensions. Additionally, by planarizing bonding pad 10, metal thinning at peripheral edges of bonding pad 10 is greatly reduced or eliminated. It should be understood that many more sequential dielectric layers and metal layers could be done without loss of control of critical dimensions during patterning and without metal thinning at the edges of bonding pad 10.

Passivation glass 28 is deposited and patterned by well-known methods in the semiconductor art. Generally, passivation layer 28 is patterned with a single rectangular opening, thereby allowing a sufficient amount of area for further processing, such as tab bonding or wire bonding.

By now it should be appreciated that a novel method has been provided for making and planarizing bonding pads and probe pads. Also, by reducing the step or height that a metal layer has to go down, control of critical dimensions is maintained, and metal thinning is either reduced or eliminated.

We claim:

1. A planarized multi-layer metal bonding pad on an integrated circuit comprising:
   a first metal bonding pad layer defining a bonding pad;
   a first dielectric layer with a multitude of vias that covers the first metal bonding pad layer, and wherein portions of the first metal bonding pad layer are exposed through the vias;
   a second metal bonding pad layer that further defines the bonding pad that covers the vias in the first dielectric layer so that electrical contact is made between the first metal bonding pad layer and the second metal bonding pad layer through the vias;
   a second dielectric layer with a multitude of vias that covers the second metal bonding pad layer, thereby exposing portions of the second metal bonding pad layer through the vias;
   a third metal bonding pad layer further defining the metal bonding pad that covers the vias in the second dielectric layer so that electrical contact is made between the second metal bonding pad layer and the third metal bonding pad layer;
   a third dielectric layer with an opening exposing a portion of the third metal bonding pad layer; and
   a fourth metal bonding pad layer that further defines the bonding pad that covers the opening in the third dielectric layer so that electrical contact is made between the third and the fourth metal bonding pads layers.

2. A planarized multi-layer metal bonding pad as claimed in claim 1 wherein the multi-layer metal bonding pad is a probe pad.

3. A planarized multi-layer metal bonding pad as claimed in claim 1 wherein the electrical connection is made by a multitude of metal plugs in the multitude of vias.

4. A planarized multi-layer metal bonding pad as claimed in claim 1 further comprising providing additional dielectric layers with a multitude of vias and providing additional metal layers that cover the additional dielectric layers so that electrical contact is made between the additional metal layer and the third metal layer.

* * * * *